(12) United States Patent
Salih et al.

(10) Patent No.: US 7,579,632 B2
(45) Date of Patent: Aug. 25, 2009

(54) MULTI-CHANNEL ESD DEVICE AND METHOD THEREFOR

(75) Inventors: Ali Salih, Mesa, AZ (US); Mingjiao Liu, Gilbert, AZ (US); Sudhama C. Shastri, Phoenix, AZ (US); Thomas Keena, Chandler, AZ (US); Gordon M. Grivna, Mesa, AZ (US); John Michael Parsey, Jr., Phoenix, AZ (US); Francine Y. Robb, Fountain Hills, AZ (US); Ki Chang, Kansas City, MO (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 133 days.

(21) Appl. No.: 11/859,624

(22) Filed: Sep. 21, 2007

(65) Prior Publication Data

US 2009/0079001 A1 Mar. 26, 2009

(51) Int. Cl.
*H01L 23/62* (2006.01)
(52) U.S. Cl. .............. 257/173; 257/355; 257/E29.014; 257/E29.335; 438/983
(58) Field of Classification Search ................. 257/173, 257/355, 551, E29.014, E29.335; 438/983
See application file for complete search history.

(56) References Cited

U.S. PATENT DOCUMENTS

| 5,880,511 | A | 3/1999 | Yu et al. |
|---|---|---|---|
| 5,990,511 | A | 11/1999 | Leas |
| 6,115,592 | A | 9/2000 | Ueda et al. |
| 6,121,669 | A | 9/2000 | Kalb et al. |
| 6,140,674 | A | 10/2000 | Hause et al. |
| 6,489,660 | B1 | 12/2002 | Einthoven et al. |
| 6,822,295 | B2 | 11/2004 | Larson |
| 6,953,980 | B2 | 10/2005 | Escoffier et al. |
| 6,984,860 | B2 | 1/2006 | Grivna et al. |
| 2003/0205775 | A1 | 11/2003 | Einthoven et al. |
| 2006/0181385 | A1 | 8/2006 | Hurley |
| 2007/0073807 | A1 | 3/2007 | Bobde |
| 2008/0121988 | A1* | 5/2008 | Mallikararjunaswamy et al. .......... 257/328 |

OTHER PUBLICATIONS

NUF9300 Data Sheet, Product Preview, "5-Line EMI Filter with ESD Protection", Copyright Semiconductor Components Industries, LLC, 2005, Apr. 2005—Rev. P1, Publication Order No. NUF9300/D, 6pps.
Data Sheet, SEMTECH, "uClamp3301D Low Voltage uClamp(tm) for ESD and CDE Protection, Protection Products—MicroClamp(tm)", Revision Oct. 25, 2004, Copyright 2004 Semtech Corp., 6pps.
Data Sheet, SEMTECH, RClamp0502B Ultra-Low Capacitance TVS for ESD and CDE Protection, Protection Products—RailClamp(r) Revision Apr. 5, 2005, Copyright 2005 Semtech Corp., 9pps.
Data Sheet, SEMTECH, "RClamp0514M RailClamp(r) Low Capacitance TVS Diode Array, Protection Products—RailClamp(r)", Revision Aug. 31, 2005, Copyright 2005 Semtech Corp., 11pps.
Data Sheet, SEMTECH, "RClamp05022P RClamp0524P Ultra Low Capacitance TVS Arrays, Protection Products—RailClamp(r)", Revision Sep. 19, 2006, Copyright 2006 Semtech Corp., 13pps.

* cited by examiner

*Primary Examiner*—Minh-Loan T Tran
(74) *Attorney, Agent, or Firm*—Robert F. Hightower

(57) ABSTRACT

In one embodiment, an ESD device is configured to include a zener diode and a P-N diode.

20 Claims, 9 Drawing Sheets

US 7,579,632 B2

MULTI-CHANNEL ESD DEVICE AND METHOD THEREFOR

CROSS-REFERENCE TO RELATED APPLICATIONS

This application is related to an application entitled "METHOD OF FORMING LOW CAPACITANCE ESD DEVICE AND STRUCTURE THEREFOR" having a Ser. No. 11/859,570, having a common assignee, and inventors Keena et al. which is filed concurrently herewith.

BACKGROUND OF THE INVENTION

The present invention relates, in general, to electronics, and more particularly, to methods of forming semiconductor devices and structures.

In the past, the semiconductor industry utilized various methods and structures to form electrostatic discharge (ESD) protection devices. According to one international specification, the International Electrotechnical Commission (IEC) specification commonly referred to as IEC 61000-4-2 (level 2), it is desirable for an ESD device to respond to a high input voltage and current within approximately 1 nanosecond (the IEC has an address at 3, rue de Varembé, 1211 Genève 20, Switzerland).

Some of the prior ESD devices used a zener diode and a P-N junction diode to attempt to provide ESD protection. In general, the prior ESD devices had to trade-off low capacitance against having a sharp breakdown voltage characteristic. The sharp breakdown voltage characteristic was needed to provide a low clamp voltage for the ESD device. In most cases, the device structures had a high capacitance, generally greater than about one to six (1-6) picofarads. The high capacitance limited the response time of the ESD device. Some prior ESD devices operated in a punch-through mode which required the devices to have a very thin and accurately controlled epitaxial layer, generally less than about 2 microns thick, and required a low doping in the epitaxial layer. These structures generally made it difficult to accurately control the clamping voltage of the ESD device and especially difficult to control low clamping voltages, such as voltages of less than about ten volts (10 V). One example of such an ESD device was disclosed in U.S. Pat. No. 5,880,511 which issued on Mar. 9, 1999 to Bin Yu et al. Another ESD device utilized a body region of a vertical MOS transistor to form a zener diode at an interface with an underlying epitaxial layer. The doping profiles and depths used for the ESD device resulted in a high capacitance and a slow response time. Additionally, it was difficult to control the light doping levels in the thin layers which made it difficult to control the breakdown voltage of the ESD device. An example of such an ESD device was disclosed in United States patent publication No. 2007/0073807 of inventor Madhur Bobde which was published on Mar. 29, 2007.

Accordingly, it is desirable to have an electrostatic discharge (ESD) device that has a low capacitance, that has a fast response time, that reacts to both a positive and a negative ESD event, that has a well controlled clamp voltage, that is easy to control in manufacturing, and that has a clamp voltage that can be controlled to over a range of voltages from a low voltage to a high voltage.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, or certain N-type of P-type doped regions, a person of ordinary skill in the art will appreciate that complementary devices are also possible in accordance with the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action. The use of the word approximately or substantially means that a value of element has a parameter that is expected to be very close to a stated value or position. However, as is well known in the art there are always minor variances that prevent the values or positions from being exactly as stated. It is well established in the art that variances of up to about ten per cent (10%) (and up to twenty per cent (20%) for semiconductor doping concentrations) are regarded as reasonable variances from the ideal goal of exactly as described. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

DETAILED DESCRIPTION OF THE DRAWINGS

Figure 1:
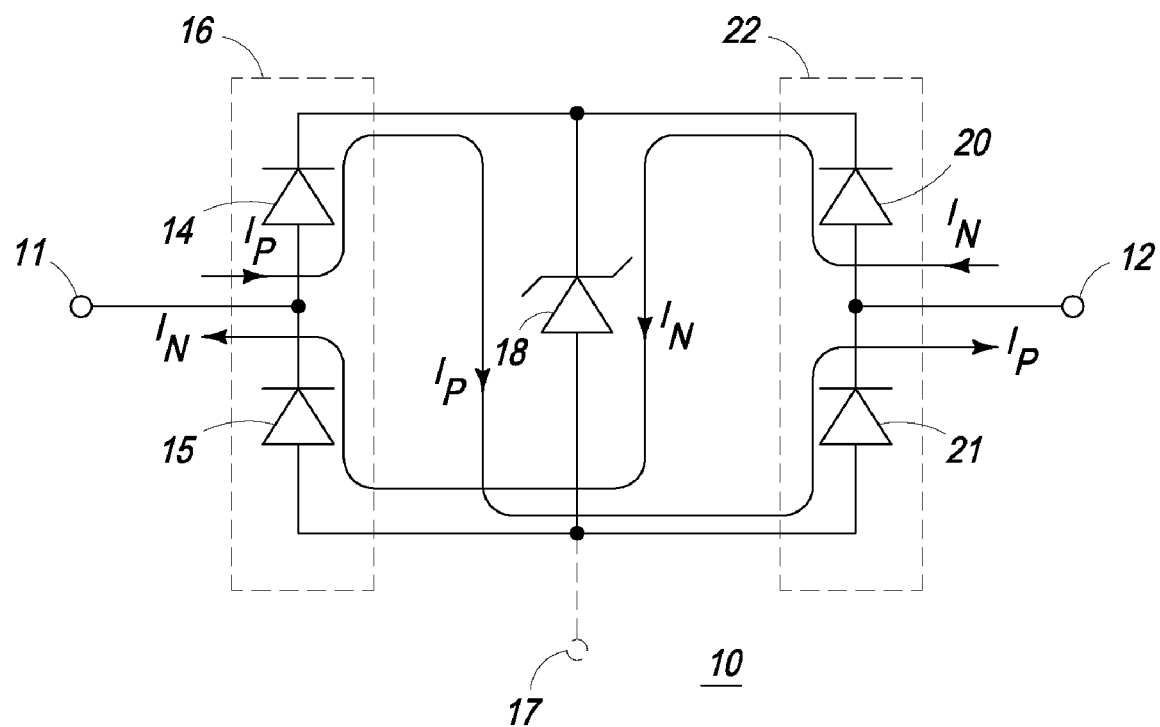
FIG. 1 schematically illustrates an embodiment of a portion of a circuit representation of an electro-static discharge (ESD) protection device in accordance with the present invention.

FIG. 1 schematically illustrates an embodiment of a portion of an electrostatic discharge (ESD) protection device or ESD device 10 that has a low capacitance and a fast response time. Device 10 includes two terminals, a first terminal 11 and a second terminal 12, and is configured to provide bidirectional ESD protection between terminals 11 and 12. Either of terminals 11 and 12 can be an input terminal or an output terminal. The output terminal usually is connected to another element (not shown) that is to be protected by device 10. For example, terminal 12 may be used as the output terminal and connected to the high side of a regulated power supply (such as a 5V supply). Device 10 is configured to have a low capacitance between terminals 11 and 12. Device 10 also is formed to limit the maximum voltage that is formed between terminals 11 and 12 to the clamp voltage of device 10. Furthermore, device 10 is formed to have a sharp knee or sharp breakdown voltage characteristic that assists in accurately controlling the value of the clamp voltage. The low capacitance assists in providing device 10 with a fast response time. Device 10 includes a plurality of steering diode channels that includes a first steering diode channel 16 and a second steering diode channel 22. Channel 16 includes a first steering diode 14 that has an anode commonly connected to terminal 11 and to a cathode of a second steering diode 15. Channel 22 includes a third steering diode 20 that has an anode commonly connected to terminal 12 and to a cathode of a fourth steering diode 21. Diodes 14, 15, 20, and 21 are formed as P-N junction diodes that have a low capacitance. A zener diode 18 is connected in parallel with each of channels 16 and 22. Diode 18 has an anode connected to the anode of diodes 15 and 21, and a cathode connected to the cathode of diodes 14 and 20.

In normal operation, device 10 is biased to a normal operating voltage, such as a voltage that is between about one volt (1V) and the zener voltage of diode 18, such as by applying about one volt (1V) to terminal 11 and a ground reference voltage to terminal 12. Because of the hereinafter described characteristics of device 10, the capacitance of device 10 remains low as the voltage between terminals 11 and 12 varies over this normal operating voltage. However, the capacitance of an ESD device is customarily specified with zero volts applied across the device. This zero voltage condition is normally referred to as a zero bias condition. As will be seen further hereinafter, at this zero bias condition the hereinafter described low capacitance features of device 10 forms very low capacitance values for diodes 14, 15, 20, and 21. Since there are two parallel paths between terminals 11 and 12, the capacitance value of each path is the additive product of the capacitances in each path. The first path includes the capacitances of diodes 14, 18 and 21 in series. Since the capacitance of capacitors in series is smaller than that of the smallest capacitor, then the capacitance of the first path is smaller than the capacitance of either of diodes 14, 18, or 21. Device 10 is formed so that the zero bias capacitance of diodes 14 and 21 are very small as will be seen further hereinafter. Similarly, the capacitance of the second path, that includes diodes 20, 18 and 15, is also very small. The overall additive value of the two paths forms a small zero bias capacitance for device 10.

If a positive electrostatic discharge (ESD) event is received on terminal 11, terminal 11 is forced to a large positive voltage relative to terminal 12. The large positive voltage forward biases diodes 14 21 and reverse biases diodes 18 in addition to diodes 15 and 20. As the voltage between terminals 11 and 12 reaches the positive threshold voltage of device 10 (the forward voltage of diodes 14 and 21 plus the zener voltage of diode 18) a positive current (Ip) flows from terminal 11 through diode 14 to diode 18, and through diodes 18 and 21 to terminal 12. The zener voltage of diode 18 clamps the maximum voltage formed between terminals 11 and 12 to approximately the zener voltage of diode 18 (plus the forward voltage of diodes 14 and 21). If a negative ESD event is received on terminal 11, terminal 11 is forced to a large negative voltage relative to terminal 12. The large negative voltage forward biases diodes 20 and 15, and reverse biases diode 18 in addition to diodes 14 and 21. As the voltage between terminals 11 and 12 reaches the negative threshold voltage of device 10 (the forward voltage of diodes 20 and 15 plus the zener voltage of diode 18) a negative current (In) flows from terminal 12 through diode 20 to diode 18, and through diodes 18 and 15 to terminal 11. The sharp knee of diode 18 causes diode 18 to rapidly clamp the maximum voltage between terminals 11 and 12 to the zener voltage of diode 18 (plus the forward voltage of diodes 15 and 20).

Figure 2:
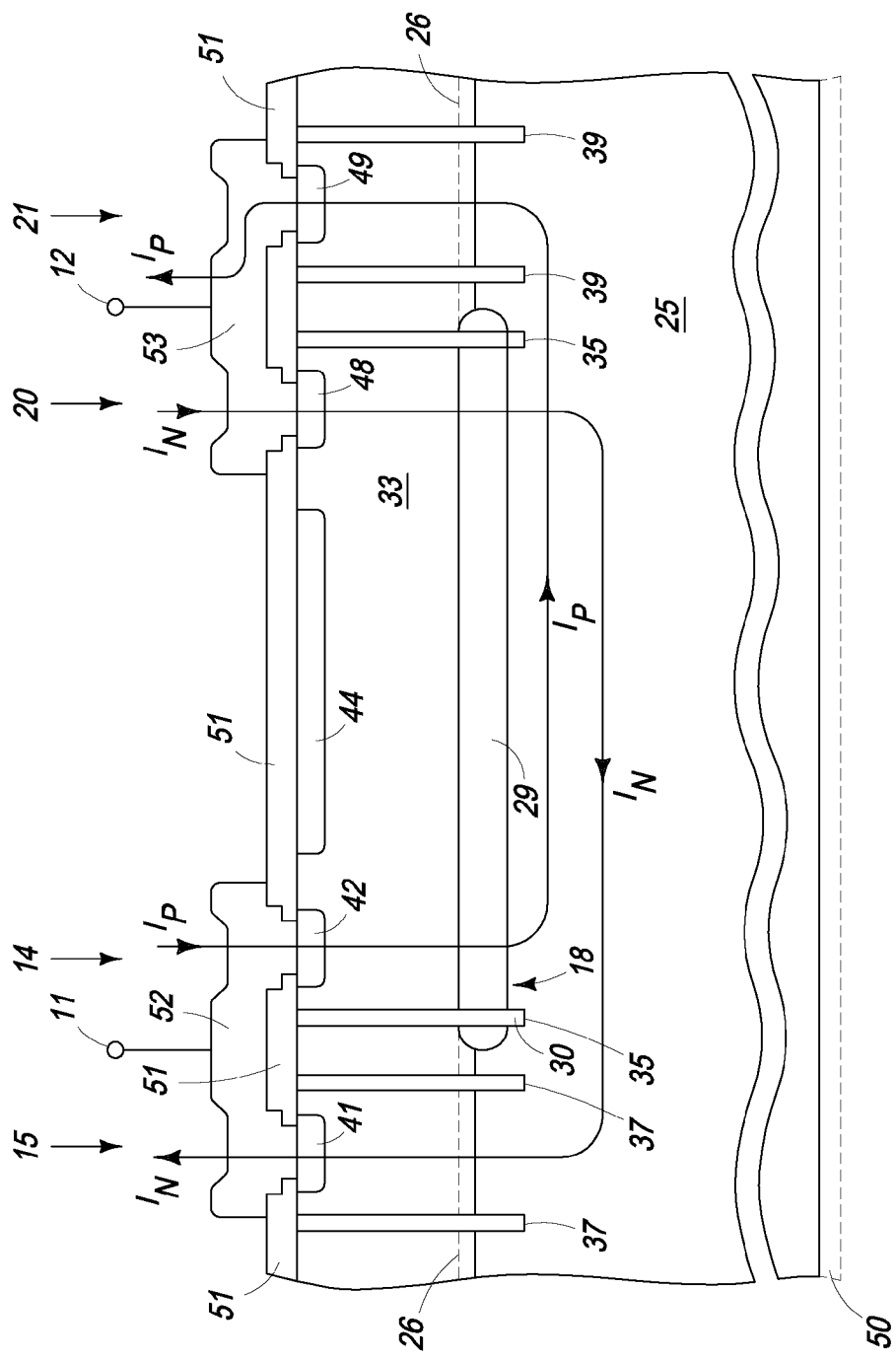
FIG. 2 illustrates a cross-section of a portion of an embodiment of the ESD device of FIG. 1 in accordance with the present invention.

FIG. 2 illustrates a cross-sectional view of a portion of an embodiment of ESD device 10. Diodes 14, 15, 20, 21, and 18 are formed on a semiconductor substrate 25. Diodes 14, 15, 20, 21, and 18 are identified in a general manner by arrows. A semiconductor layer 33 is formed on substrate 25, such as by epitaxial growth, and a portion of layer 33 may function as a drift region for diodes 14, 15, 20, and 21.

Figure 3:
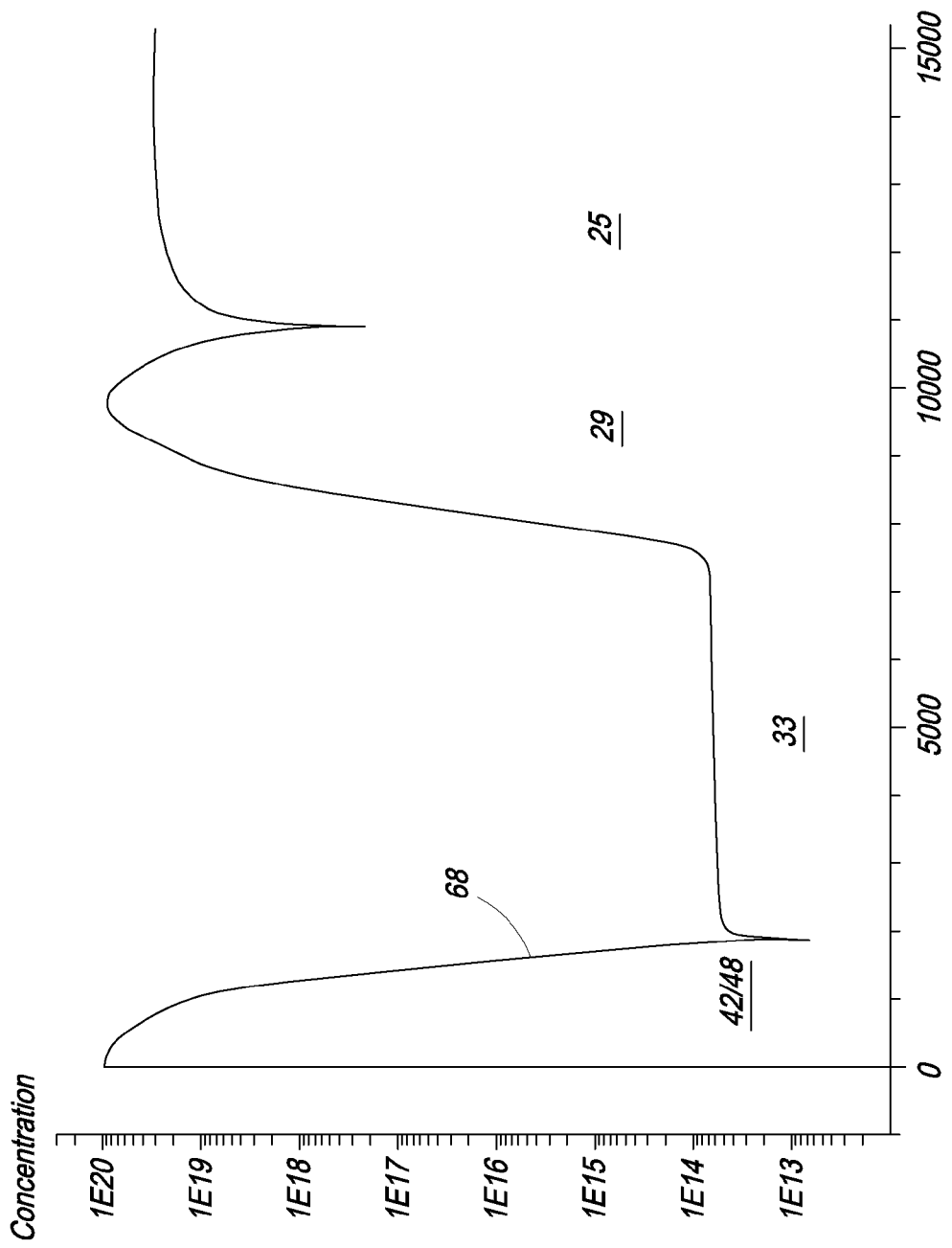
FIG. 3 is a graph illustrating some of the carrier concentrations of the ESD device of FIG. 1 and FIG. 2 in accordance with the present invention.

FIG. 3 is a graph illustrating the carrier concentration profile of the preferred embodiment of device 10. The abscissa indicates depth from the surface of layer 33 into device 10 and the ordinate indicates increasing value of the carrier concentration. A plot 68 illustrates the carrier concentration of device 10 that results from a positive bias applied from terminal 11 to terminal 12 (such as by a positive ESD event). This description has references to FIG. 1-FIG. 3.

A semiconductor region 29 is formed near the interface of the dopants that form layer 33 and the dopants of substrate 25 in order to form diode 18. In the preferred embodiment, substrate 25 is formed with a P-type conductivity having a doping concentration that is no less than approximately $1\times10^{19}$ atoms/cm$^3$ and preferably is between approximately $1\times10^{19}$ and $1\times10^{21}$ atoms/cm$^3$. In this preferred embodiment, semiconductor region 29 is formed as an N-type region having a peak doping concentration that is no less than approximately $1\times10^{19}$ atoms/cm$^3$ and preferably is between approximately $1\times10^{19}$ and $1\times10^{21}$ atoms/cm$^3$. Additionally, the thickness of region 29 generally is less than one micron and preferably is between about one and three (1-3) microns. Because of the small thickness of region 29 in addition to the high doping concentration of region 29 and substrate 25, when device 10 receives a positive voltage from terminal 11 to terminal 12, the voltage causes the carrier concentration to be confined to a small and high density area within region 29 and near to the interface with substrate 25. This high concentration of carriers and dopants provides zener diode 18 with a very sharp transition or knee and allows very accurate control over the breakdown voltage or zener voltage of diode 18. The breakdown voltage or zener voltage of diode 18 can be adjusted by changing the carrier concentration or carrier profile of region 29 and/or of substrate 25. This allows precisely controlling the breakdown voltage for specific applications such as for five or twelve or twenty-four volt (5V, 12V, 24V) breakdown voltage application.

Layer 33 preferably is formed to have a lower peak doping concentration that is at least one order of magnitude less than the doping concentration of region 29 and generally is between about $1\times10^{13}$ and $1\times10^{17}$ atoms/cm$^3$. Layer 33 and region 29 may be formed on substrate 25 by a variety of methods that are well known to those skilled in the art. For example, a thin N-type epitaxial layer, illustrated by a dashed line 26, may be formed on substrate 25 as a first portion of layer 33. This first portion may be doped to form region 29. Thereafter, the remainder of layer 33 may be formed.

Subsequently, isolation trenches 35, 37, and 39 may be formed in order to isolate the portion of layer 33 where diodes 14 and 20 are to be formed from the portion of layer 33 where diodes 15 and 21 are to be formed. Trenches 35, 37, and 39 generally are formed by a creating openings from a top surface of layer 33, through layer 33, and extending into substrate 25. Trench 35 also extends through region 29 a distance into substrate 25 in order to prevent conduction laterally through region 29 between diode 18 and either of diodes 15 or 21. Trenches 35, 37, and 39 are provided with isolation such as by forming a dielectric liner 30 along the sidewalls and bottoms of trenches 35, 37, and 39 and filling the remaining opening with a dielectric or with doped or undoped polysilicon. Alternately, dielectric liner 30 may be formed along the sidewalls but not the bottom of trenches 35, 37, and 39, and the remainder of the opening may be filled with a dielectric or with a material that has the conductivity and doping of substrate 25. Methods to form trenches 35, 37, and 39 are well known to those skilled in the art. Because trench 35 extends through region 29, it reduces alignment tolerances and makes it easier to reliably produce device 10. Trench 35 preferably is formed as a closed polygon with a periphery that has an opening which encloses a portion of layer 33, thus, trench 35 may be regarded as a multiply-connected domain. Similarly, each of trenches 37 and 39 may be regarded as a multiply-connected domain. Each of trenches 35 and 37 may be viewed as a blocking structure that minimizes electrical coupling between the enclosed portions and other portions of device 10.

Diode 14 includes a doped region 42 that is formed on the surface of layer 33 with the same conductivity as substrate 25. Similarly, diode 20 includes a doped region 48 that is formed on the surface of layer 33 with the same conductivity as substrate 25. Regions 42 and 48 are formed to extend into layer 33 and overlie region 29. Regions 42 and 48 usually are positioned so that the periphery of regions 42 and 48, such as a periphery formed at the surface of layer 33, is completely surrounded by trench 35. Preferably, trench 35 is one continuous trench that is formed around regions 42 and 48. Because trench 35 extends through layer 33, it reduces the amount of layer 33 that is near regions 42 and 48 thereby assisting in reducing the capacitance of diodes 14 and 20. The peak doping concentration of regions 42 and 48 generally is greater than the peak doping concentration of layer 33 and preferably is approximately equal to the peak doping concentration of substrate 25. Regions 42 and 48 generally are formed to extend a distance no greater than about two (2) microns and preferably about one tenth to two (0.1-2) microns from the surface into layer 33. The large differential doping concentration between region 42 and layer 33 and also between region 48 and layer 33 and the shallow depth of regions 42 and 48 assists in providing respective diodes 14 and 20 with a very small zero bias capacitance. This very small zero bias capacitance of diodes 14 and 20 assists in forming a small zero bias capacitance for device 10 as indicated hereinbefore. The capacitance of each of diodes 14, 18, and 20 at zero bias generally is less than about 0.4 picofarads and the equivalent series capacitance of diodes 14, 18, and 20 forms a capacitance for device 10 that is about 0.2 picofarads and preferably is no greater than about 0.01 picofarads.

A doped region 49 is formed in layer 33 with the opposite conductivity to substrate 25 in order to form diode 21. Similarly, a doped region 41 is formed in layer 33 with the opposite conductivity to substrate 25 in order to form diode 15. Regions 41 and 49 are formed on the surface of layer 33 and preferably extend approximately the same distance into layer 33 as regions 42 and 48. However, regions 41 and 49 do not overlie region 29. Region 41 is positioned so that the periphery of region 41, such as the periphery at the surface of layer 33, is completely surrounded by trench 37 and region 49 is positioned so that the periphery of region 49, such as the periphery at the surface of layer 33, is completely surrounded by trench 39. Each of trenches 37 and 39 preferably are formed as one continuous trench. Because trenches 37 and 38 extend through layer 33, they reduce the amount of layer 33 that is near respective regions 41 and 49 thereby assisting in reducing the capacitance of respective diodes 15 and 21. In the preferred embodiment, regions 41 and 49 have a peak doping concentration that is greater than the peak doping concentration of layer 33 and preferably is approximately equal to the peak doping concentration of substrate 25.

Regions 42 and 48 generally are separated from region 29 by a distance that assists in minimizing the capacitance of diodes 15 and 21. The spacing generally is approximately two to twenty (2-20) microns. The portion of layer 33 that is between regions 42 and 29 and between regions 48 and 29 forms a drift region of respective diodes 14 and 20. The thickness of the drift region of layer 33 generally is at least around two microns in order to reduce the formation of parasitic transistors and to ensure that device 10 does not operate in a punch-through operating region.

An optional doped region 44 may be formed in layer 33 with the opposite conductivity to substrate 25. Region 44 usually is formed to overlie region 29 and positioned between regions 42 and 48, thus, region 44 is within the multiply-connected domain formed by trench 35. Region 44 preferably extends approximately the same distance into layer 33 as regions 42 and 48. Region 44 functions as a channel stop that assists in preventing the formation of an inversion channel near the surface of layer 33 between diodes 14 and 20. Additionally, the high differential doping concentration between region 44 and layer 33 assists in preventing the formation of a parasitic bipolar transistor between region 42, layer 33, and region 48. In some embodiments where the differential doping concentration does not form such a parasitic bipolar transistors, region 44 may be omitted. As can be seen, device 10 usually is devoid of a doped region having a conductivity that is the same as substrate 25 and that is positioned between diode 14 and region 29, thus between regions 42 and 29.

When device 10 receives a positive ESD voltage on terminal 11 relative to terminal 12, diodes 14 and 21 are forward biased and diodes 15 and 20 are reverse biased. Because of these depletion regions, the carrier density in layer 33 is further reduced from the zero bias condition (plot 68) which assists in further reducing the capacitance of device 10. The capacitance of device 10 at zero bias generally is less than about 0.4 picofarads and the equivalent series capacitance for device 10 is about 0.2 picofarads and preferably is no greater than about 0.1 picofarads.

When device 10 receives a negative voltage on terminal 11 relative to terminal 12, diodes 20 and 15 are forward biased and diodes 14 and 21 are reverse biased. Because of these depletion regions, the carrier density in layer 33 is further reduced from the zero bias condition which assists in further reducing the capacitance of device 10. Note that for both of the ESD discharge events, the ESD current flow is into and out of the top surface of substrate 25 and layer 33. The ESD current does not flow through the bottom surface of substrate 25, thus, the bottom surface of substrate 25 generally has a floating potential.

Subsequently, a dielectric 51 may be formed on the surface of layer 33. Openings generally are formed through dielectric 51 to expose portions of regions 41, 42, 48, and 49. A conductor 52 may be applied to make electrical contact to both regions 41 and 42. A conductor 53 may be applied to make electrical contact to both regions 48 and 49. Conductors 52 and 53 usually are subsequently connected to respective terminals 11 and 12. Since the ESD current flow of device 10 is not through the bottom surface of substrate 25, a conductor generally is not applied thereto.

When an electrode-static discharge occurs, there is generally a large voltage and current spike that occurs over a brief period of time. Generally, the peak current and peak voltage occurs over a period of a few nanoseconds, typically less than two nanoseconds (2 nsec.) and could last for only about one nanosecond (1 nsec.). The current generally decreases to a plateau for another time interval usually around twenty (20) nanoseconds and slowly decreases over another twenty to forty (20-40) nanoseconds. The peak value of the current could be between one to thirty amperes (1 to 30 amps) and the peak voltage could be between two thousand and thirty thousand volts (2000-30000 V). The size and response time of the elements of device 10 preferably are configured to respond to the voltage during the time interval of the peak voltage and conduct the peak current. During an ESD event between terminals 11 and 12, either of diodes 14 and 21 are connected in series and diodes 15 and 20 are connected in series, the effective capacitance is the total series capacitance. Because capacitors in series result in a capacitance that is less than the smallest capacitance, the low capacitance ensures that the capacitance of device 10 is low enough for device 10 to respond to the ESD event and conduct the ESD current during the peak ESD voltage and current.

In another embodiment, device 10 also includes a third terminal 17 (illustrated in FIG. 1 by dashed lines). In most applications that would use this embodiment of device 10, terminal 17 would be connected to a ground reference potential of the system in which device 10 is used. This three terminal configuration provides protection between terminals 11 and 12 for large voltages received on either of terminals 11 or 12. Referring again to FIG. 2, terminal 17 is formed by forming a conductor 50 (illustrated by dashed lines), such as a metal, to the bottom surface of substrate 25 and providing a connection from conductor 50 to terminal 17.

Figure 4:
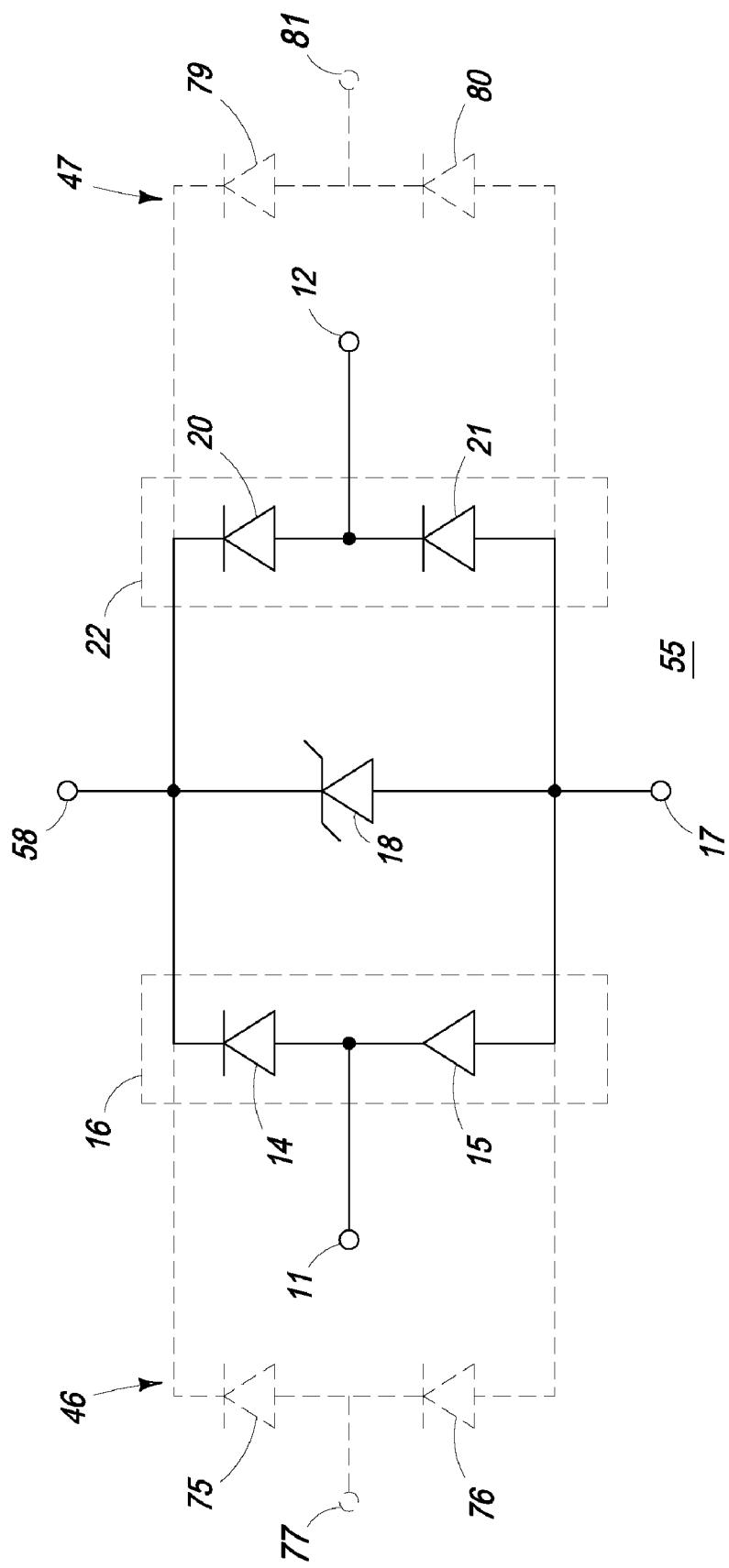
FIG. 4 schematically illustrates an embodiment of a portion of a circuit representation of another electrostatic discharge (ESD) protection device in accordance with the present invention.

FIG. 4 schematically illustrates an embodiment of a portion of a circuit representation of an ESD device 55 that is an alternate embodiment of device 10 that was described in the description of FIG. 1-FIG. 3. The circuit schematic of device 55 is similar to the circuit schematic of device 10 except that device 55 has a fourth terminal 58 that is connected to the cathode of diode 18. Additionally, those skilled in the art will understand that device 55, and also device 10, may include additional channels such as another channel 46 in parallel with channel 16 and another channel 47 in parallel with channel 22. Channel 46 includes series connected P-N diodes 75 and 76 that have a terminal 77 connected to a common node of diodes 75 and 76. Also, channel 47 includes series connected P-N diodes 79 and 80 that have a terminal 81 connected to a common node of diodes 79 and 80. In an application that uses device 55, terminal 58 usually is connected to the voltage rail of a power supply and terminal 17 is connected to the common reference potential. Terminals 11 and 12 provide ESD protection for signals that are passed through terminals 11 and 12.

Figure 5:
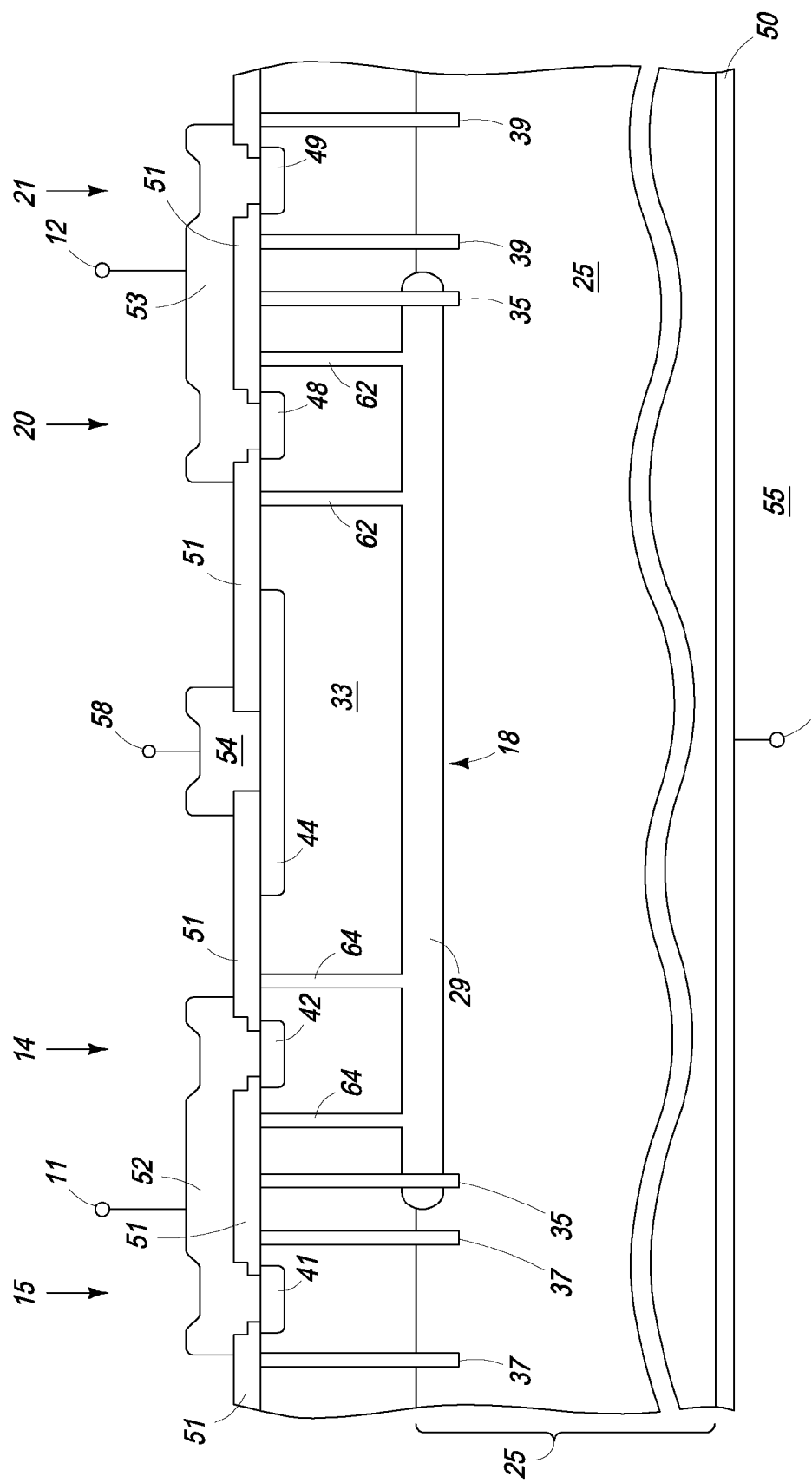
FIG. 5 illustrates a cross-sectional portion of an embodiment of the ESD device of FIG. 4 in accordance with the present invention.

FIG. 5 illustrates a cross-sectional portion of device 55. The cross-section of device 55 is similar to the cross-section of device 10 except that device 55 includes a conductor 54 that is connected to terminal 58, and further includes conductors 62 and 64. For the embodiment illustrated in FIG. 5, region 44 is not optional and is utilized to provide conductor 54 a low resistance electrical connection to layer 33. The low resistance electrical connection facilitates connecting terminal 58 to the cathode of diode 18.

It is desirable to form diodes 14 and 20 to have substantially equal capacitance values. In some cases, a mild inversion layer may form near the surface of layer 33 between regions 44 and 48 and between regions 44 and 42. Such an inversion layer could affect the capacitance of diodes 14 and 20. Conductors 62 and 64 assist in minimizing disturbances in the capacitance values of diodes 14 and 20 so that the values are more equally matched. Each of conductors 62 and 64 may be viewed as a blocking structure that minimizes electrical coupling between the enclosed portions and other portions of device 10. Conductor 62 is formed to extend from the surface of layer 33, through layer 33, and intersect region 29. The periphery of conductor 62 generally forms a closed polygon that encloses a portion of layer 33. Region 48 is positioned within the portion of layer 33 that is enclosed by conductor 62. Conductor 62 generally is positioned about two to twenty (2-20) microns away from region 48 in order to prevent increasing the capacitance of region 48, thus of diode 20. Conductor 64 is also formed to extend from the surface of layer 33, through layer 33, and intersect region 29. The periphery of conductor 64 generally forms a closed polygon that encloses another portion of layer 33. Region 42 is positioned within the portion of layer 33 that is enclosed by conductor 64. Conductor 64 generally is positioned about two to twenty (2-20) microns away from region 42 in order to prevent increasing the capacitance of region 42, thus of diode 14. Each of conductors 62 and 64 may be considered a separate multiply-connected domain. Conductors 62 and 64 generally are formed by making an opening that extends from the surface through layer 33 to expose a portion of region 29. Thereafter, the opening is filled with a conductor, such as doped polysilicon, in order to form conductors 62 and 64. In another embodiment, the openings in which conductors 62 and 64 are formed may have a dielectric liner on the sidewalls but not on the bottom. Omitting the liner on the bottom facilitates forming electrical connection to region 29. In yet another embodiment, conductors 62 and 64 may be replaced with an isolation trench such as trench 35. However, such an isolation trench would extend to the surface of region 29 but would not extend through region 29 in order to allow conduction through region 29. Those skilled in the art will appreciate that conductors 62 and 64 may be added to device 10 of FIG. 1 and FIG. 2.

Although P-N diodes 75, 76, 79, and 80 are not illustrated in FIG. 5, those skilled in the art will appreciate that diodes 75 and 79 should be formed as doped regions overlying region 29 similar to respective diodes 14 and 20 and corresponding regions 42 and 48. The doped regions of diodes 75 and 79 generally would be enclosed by trenches 35. In order to form diodes 75 and 79, region 29 may be made larger, such as extended in a direction that would be perpendicular to the page shown in FIG. 5. Alternately, another region similar to region 29 may be formed on substrate 25 and electrically connected to region 29. Thus, region 29 or the additional region that is similar to region 29 would electrically connect the cathodes of diodes 75 and 79 to the cathode of diode 18. Diodes 76 and 80 would be formed in layer 33 and not overlying region 29. Each of the doped regions used for diodes 76 and 80 should be within a closed polygon that is formed by a trench similar to either of trenches 37 or 39. Thus, the anode of diodes 76 and 80 would be connected to the anode of diode 18 by substrate 25.

Figure 6:
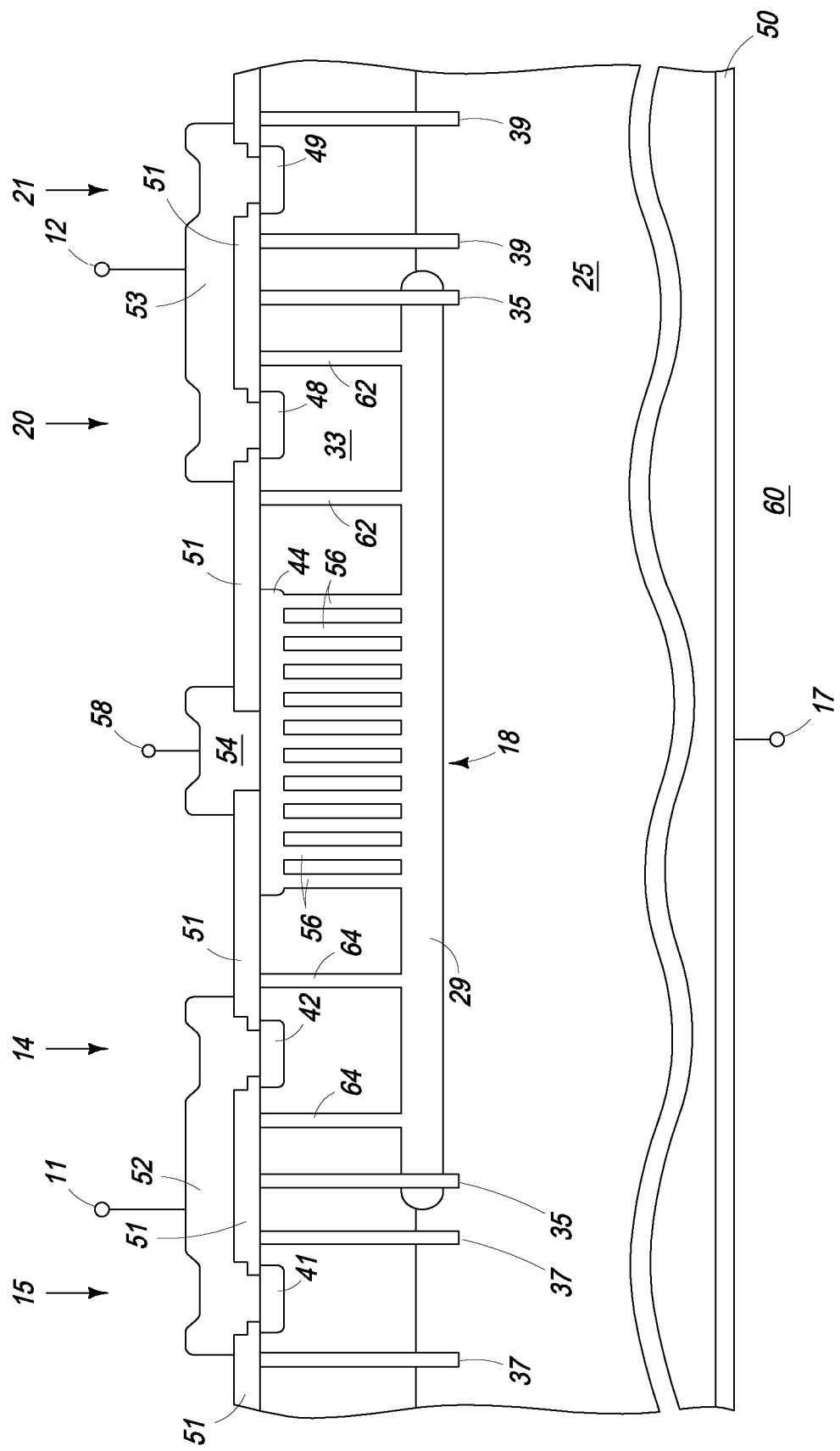
FIG. 6 illustrates a cross-sectional portion of another embodiment of the ESD device of FIG. 4 in accordance with the present invention.

FIG. 6 illustrates a cross-sectional portion of an ESD device 60 that is an alternate embodiment of device 55 that was explained in the description of FIG. 5. The circuit schematic of device 60 is substantially the same as the circuit schematic of device 55. However, device 60 includes a plurality of conductors 56 that extend from region 44, through layer 33, and intersect with region 29. Conductors 56 reduce the resistance of the connection between conductor 54 and the cathode of diode 18. Those skilled in the art will appreciate that conductors 56 can provide reduced resistance without extending entirely through layer 33 to region 29. Generally, conductors 56 should extend at least one-half of the distance from the surface of layer 33 toward region 29 and may extend further up to a distance that touches region 29. Conductors 56 generally are formed in a manner similar to conductors 62 and 64.

Those skilled in the art will appreciate that conductors 62 and 64 may be omitted from device 60.

Figure 7:
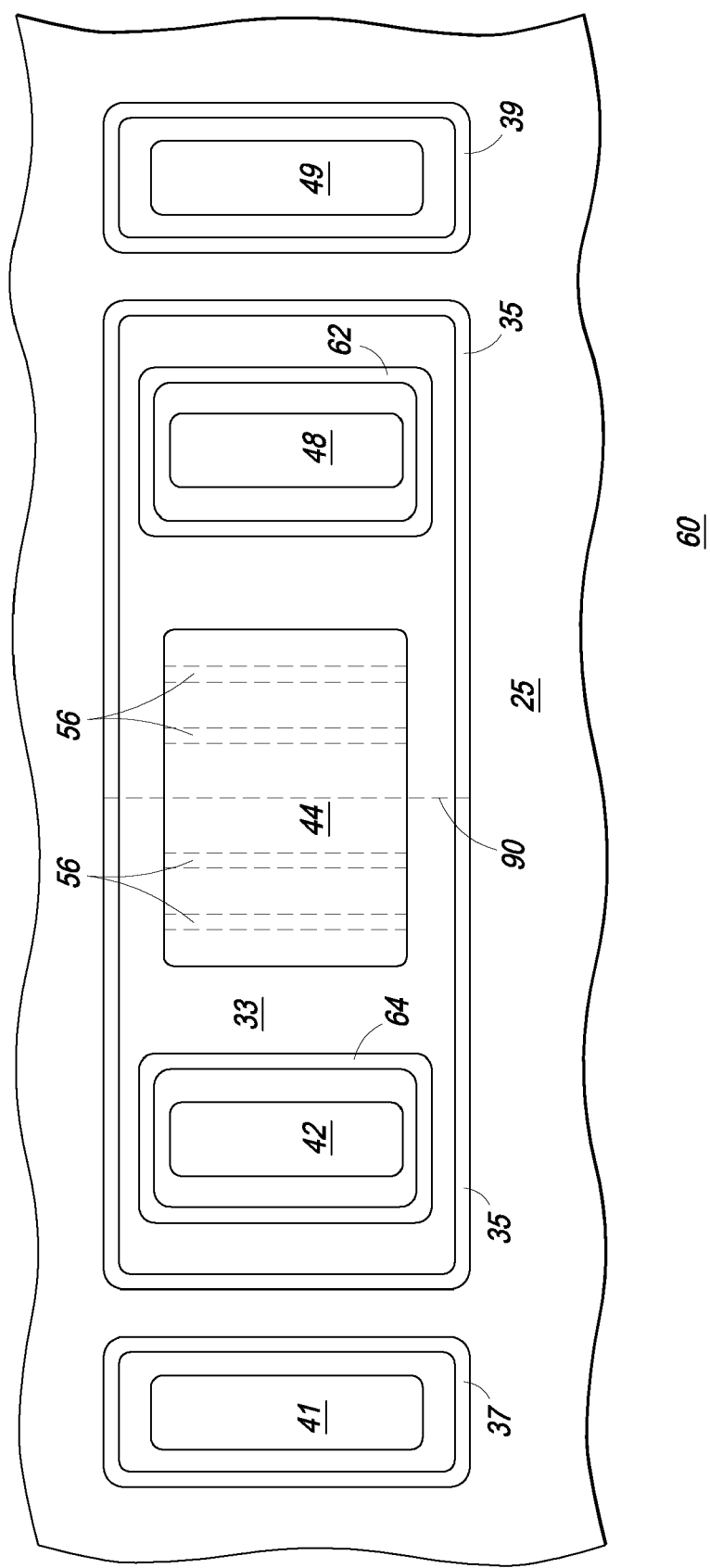
FIG. 7 illustrates a plan view of the ESD device of FIG. 6 in accordance with the present invention.

FIG. 7 illustrates a plan view of device 60 that was explained in the description of FIG. 6. FIG. 7 illustrates device 60 prior to forming conductors 52, 53, and 54 so that the topology of device 60 may be seen. FIG. 7 illustrates the multiply-connected characteristic of trenches 35, 37, and 39 in addition to the multiply-connected characteristics of conductors 62 and 64. Conductors 56 are illustrated in FIG. 7 in a general way by dashed lines.

Figure 8:
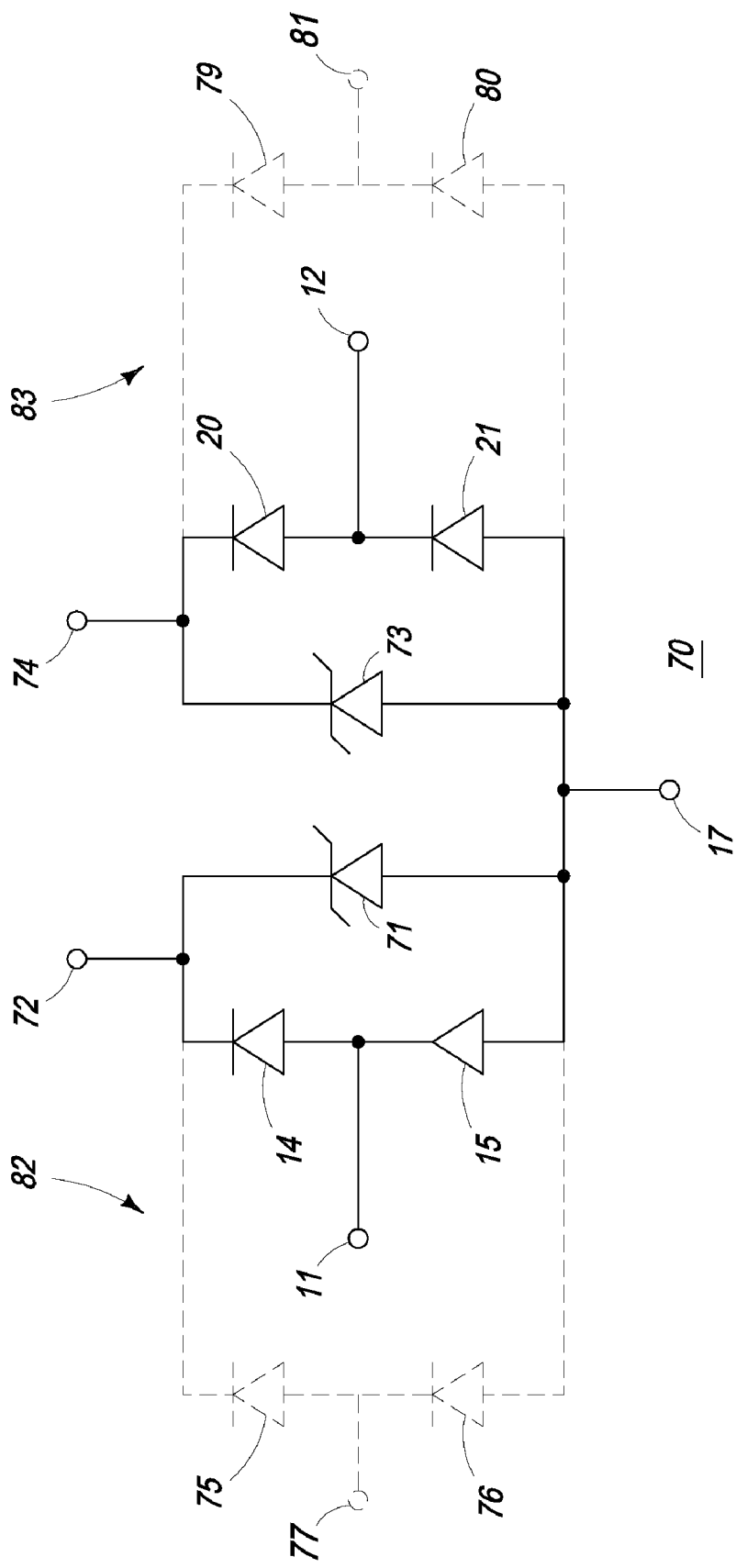
FIG. 8 schematically illustrates an embodiment of a portion of a circuit representation of a still another electrostatic discharge (ESD) protection device in accordance with the present invention.

FIG. 8 schematically illustrates an embodiment of a portion of a circuit schematic of an ESD device 70 that is an alternate embodiment of device 55 that was explained in the description of FIG. 5-FIG. 7. Device 70 includes two ESD devices with each ESD device optionally having multiple channels. A first ESD device 82 includes a zener diode 71 connected in parallel with P-N diodes 14, 15, and optionally diodes 75, and 76. Device 82 has input/output terminals 11 and 77 and also includes a terminal 72 that provides a connection to the cathode of diode 71. A second ESD device 83 includes a zener diode 73 connected in parallel with P-N diodes 20, 21, and optionally diodes 79, and 80. Device 83 has input/output terminals 12 and 81 and also includes a terminal 74 that provides a connection to the cathode of diode 73. Devices 82 and 83 have a common connection to terminal 17 at the anode of diodes 71 and 73 and diodes 15 and 21. Terminals 72 and 74 may be left floating, connected to each other, or connected to separate inputs to meet the requirements of different applications.

Figure 9:
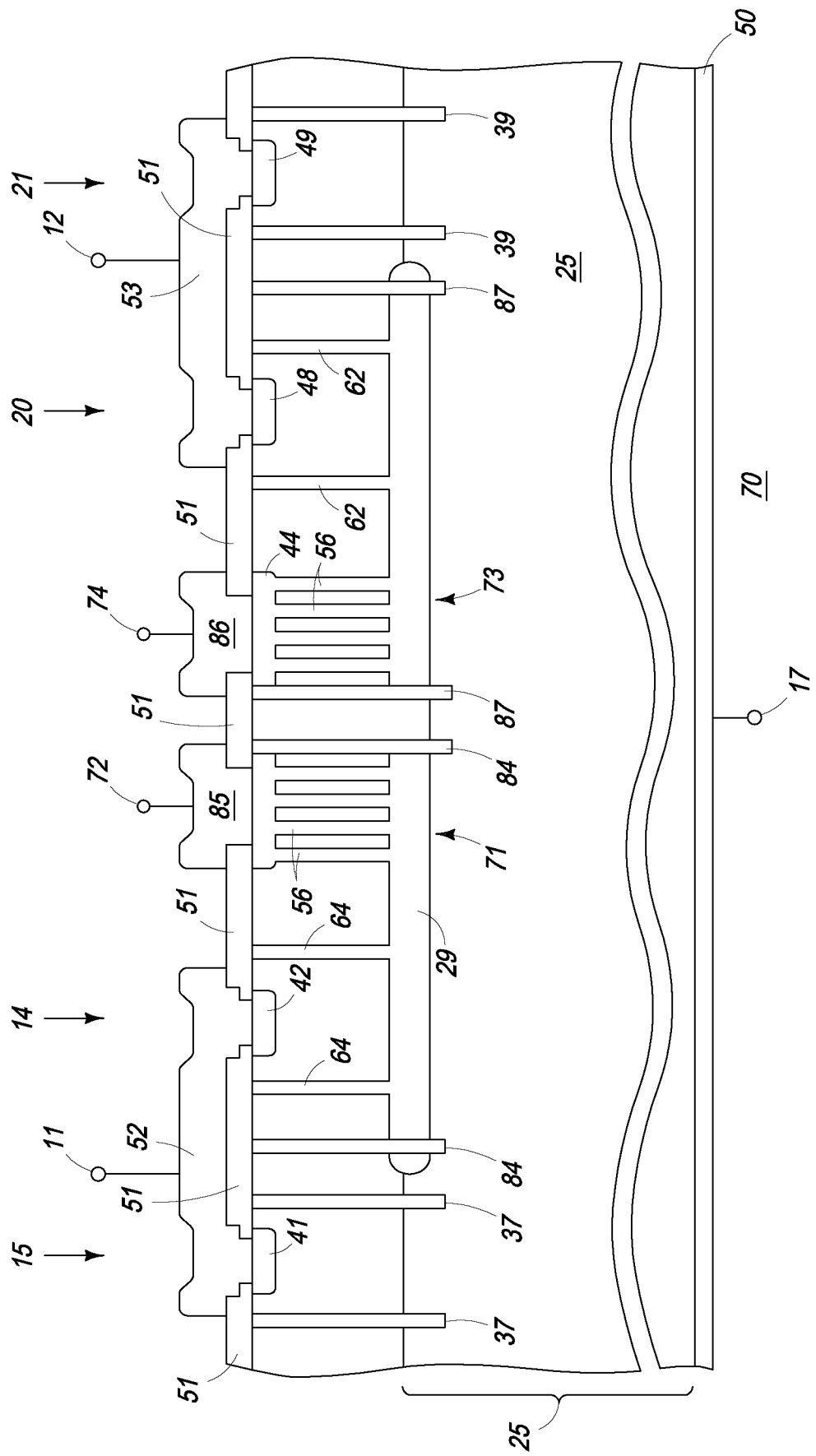
FIG. 9 illustrates a cross-sectional portion of an embodiment of the ESD device of FIG. 8 in accordance with the present invention.

FIG. 9 illustrates a cross-sectional portion of an embodiment of ESD device 70 that was described in the description of FIG. 8. The cross-section of device 70 is similar to the cross-section of device 60. However, device 70 includes isolation trenches 84 and 87 that replace trench 35. Device 70 also includes conductors 85 and 86 that replace conductor 54. Trench 84 extends from the surface of layer 33, through layer 33, and through region 29 into substrate 25. Trench 84 separates layer 33 into a first portion and trench 87 separates layer 33 into a second portion. Trench 84 forms on the surface of layer 33 a closed polygon that encloses region 42, conductor 64, and a portion of the plurality of conductors 56. Similarly, trench 87 forms on the surface of layer 33 another closed polygon that encloses region 48, conductor 62, and another portion of the plurality of conductors 56. Thus, trenches 84 and 87 divide the region that was formerly enclosed by trench 35 (FIG. 7) into two closed polygons. These two portions of layer 29 that are formed by trenches 84 and 87 are electrically isolated laterally due to trenches 84 and 87 extending through region 29.

The two portions of region 29 that are separated by trenches 84 and 87 form respective zener diodes 71 and 73. The two portions preferably extend outside of the polygons formed by each of trenches 84 and 87. Each of trenches 84 and 87 also enclose a portion of region 44, such as first and second portions. Conductor 85 is formed to electrically contact the first portion of region 44 to form an electrical connection to the first portion of region 29, thus, to the cathode of diode 71. Conductor 86 is formed to electrically contact the second portion of region 44 to form an electrical connection to the second portion of layer 29, thus, to the cathode of diode 73. Consequently, trenches 84 and 87 facilitate forming two ESD devices from one region 29.

Those skilled in the art will appreciate that conductors 85 and 86 may be omitted from device 70 thereby removing terminals 72 and 74.

In another embodiment of device 70, trench 35 may be retained and one trench 84 may be used to bisect the closed polygon formed by trench 35 into two closed polygons. In FIG. 7 for example, trench 84 could extend laterally at least through trench 35, through layer 33, through region 44 and extend into the other edge of trench 35 (as illustrated in FIG. 7 by a dashed line 90.

Those skilled in the art will appreciate that device 10 of FIG. 1-FIG. 3 may use trenches 84 and 87 to replace trench 35. Additionally, region 44 may also be omitted. Such as embodiment simplifies the process steps used to form such an embodiment of device 10.

Although the doping concentrations given for region 29 are for the preferred embodiment of a five volt (5V) breakdown voltage for respective diodes 18, 71, and 73, those skilled in the art will appreciate that the doping concentrations may have to change for other breakdown voltages. For example, for an eighty volt (80V) breakdown voltage, the doping concentration of region 29 may be decreased, or the doping concentration of substrate 25 may be decreased, or region 29 along with substrate 25 may be decreased.

In view of all of the above, it is evident that a novel device and method is disclosed. Included, among other features, is forming an ESD device that has a lateral current flow through the device and not a vertical current flow. Additionally, the ESD device has a highly doped P-type substrate, a lightly doped N-type layer on the substrate, and a highly doped N-type layer that is positioned adjacent to a portion of the substrate and between the lightly doped N-type layer in order to form a zener diode. Also included is a highly doped P-type layer overlying the highly doped N-type layer in order to form a P-N diode. The doping concentrations and thicknesses result in an ESD device that can respond to an ESD event within less than one nanosecond (1 nsec.). Conductors 62 and 64 minimize capacitance mismatch between the channels of ESD device thereby reducing the response time. The ESD device also includes conductor trenches 56 to reduce the internal resistance.

While the subject matter of the invention is described with specific preferred embodiments, it is evident that many alternatives and variations will be apparent to those skilled in the semiconductor arts. For example, all the doping types may be reversed. Those skilled in the art will appreciate that trenches 37 and 39 may be removed if trench 35 remains and that trench 35 may be omitted if trenches 37 and 39 remain, and device 10 will be functional and have a low capacitance to respond in the time intervals as described hereinbefore. Although the devices were described herein as being formed on a silicon substrate, those skilled in the art will appreciate that other semiconductor materials may be used including gallium arsenide, silicon carbide, gallium nitride, and other semiconductor materials. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. An ESD device comprising:
   a semiconductor substrate of a first conductivity type and having a first doping concentration, the semiconductor substrate having first and second surfaces;
   a first semiconductor layer of a second conductivity type on the first surface of the semiconductor substrate, the first semiconductor layer having a first surface that is opposite to the first surface of the semiconductor substrate and having a second doping concentration;
   a first semiconductor region of the second conductivity type positioned between a first portion of the first semiconductor layer and the first surface of the semiconductor substrate, the first semiconductor region forming a zener diode with dopants of the semiconductor substrate;
   a first P-N diode formed in the first semiconductor layer and overlying a first portion of the first semiconductor region;
   a first blocking structure formed as a first closed polygon having a periphery that surrounds the first P-N diode; and
   a second P-N diode formed in the first semiconductor layer and external to the first closed polygon.

2. The ESD device of claim 1 wherein the ESD device is devoid of a doped region of the first conductivity type positioned between the first P-N diode and the first semiconductor region.

3. The ESD device of claim 1 wherein the first P-N diode includes a first doped region of the first conductivity type formed on a top surface of the first semiconductor layer.

4. The ESD device of claim 1 wherein the first doping concentration is no less than approximately $1 \times 10^{19}$ atoms/cm$^3$ and the second doping concentration is no greater than approximately $1 \times 10^{17}$ atoms/cm$^3$.

5. The ESD device of claim 1 further including a first doped region of the second conductivity type formed on a surface of the first semiconductor layer and overlying a second portion of the first semiconductor region, the first doped region laterally separated from the first P-N diode.

6. The ESD device of claim 5 further including a first conductor forming electrical contact to the first doped region at the surface of the first semiconductor layer.

7. The ESD device of claim 5 further including a plurality of conductors of the second conductivity type having a doping concentration that is greater than the second doping concentration, the plurality of conductors extending from the first doped region a first distance into the first semiconductor layer toward the first semiconductor region.

8. The ESD device of claim 5 further including a third P-N diode overlying a third portion of the first semiconductor region and spaced laterally apart from both the first P-N diode and the first doped region; and an isolation trench extending from the first surface of the first semiconductor layer, through first semiconductor layer, through the first semiconductor region, and into the semiconductor substrate wherein the isolation trench is positioned between the first P-N diode and the third P-N diode.

9. The ESD device of claim 5 wherein the first blocking structure includes a first conductor of the second conductivity type having a doping concentration that is greater than the second doping concentration, the first conductor extending from the first surface of the first semiconductor layer through the first semiconductor layer to the first semiconductor region wherein the first conductor surrounds the first P-N diode at a periphery that is at the first surface of the first semiconductor layer.

10. The ESD device of claim 1 wherein the first blocking structure includes a first conductor of the second conductivity type having a doping concentration that is greater than the second doping concentration, the first conductor extending from the first surface of the first semiconductor layer through the first semiconductor layer to the first semiconductor region wherein the first conductor formed to surround the first P-N diode at a periphery that is at the first surface of the first semiconductor layer.

11. The ESD device of claim 1 further including a third P-N diode formed as a doped region of the first conductivity type overlying a second portion of the first semiconductor region and spaced laterally apart from the first P-N diode.

12. The ESD device of claim 1 wherein the first blocking structure includes an isolation trench extending from the first surface of the first semiconductor layer, through first semiconductor layer, through the first semiconductor region, and into the semiconductor substrate, wherein the isolation trench forms a multiply-connected domain with the periphery parallel to a periphery of the first semiconductor region.

13. A method of forming an ESD device comprising:
    forming a plurality of steering diode channels including a first channel having a first P-N diode and a second channel having a second P-N diode;
    coupling a zener diode in parallel with at least one of the first channel or the second channel;
    providing a semiconductor substrate of a first conductivity type and having a first doping concentration, the semiconductor substrate having first and second surfaces;
    forming on the first surface of the semiconductor substrate a first semiconductor layer of a second conductivity type having a second doping concentration that is less than the first doping concentration including forming the first semiconductor layer having a first surface that is opposite to the first surface of the semiconductor substrate;
    forming a first semiconductor region of the second conductivity type positioned between a first portion of the first semiconductor layer and the first surface of the semiconductor substrate wherein the zener diode is formed by the first semiconductor region;
    forming a first conductor extending from the first surface of the first semiconductor layer, through the first semiconductor layer and intersecting the first semiconductor region wherein the first conductor forms a first multiply-connected domain that encloses a first portion of the first semiconductor layer; and
    forming the first P-N diode in the first portion of the first semiconductor layer.

14. The method of claim 13 wherein forming on the first surface of the semiconductor substrate the first semiconductor layer includes forming the second doping concentration no greater than approximately $1 \times 10^{17}$ atoms/cm$^3$ and forming the first doping concentration no less than approximately $1 \times 10^{19}$ atoms/cm$^3$.

15. The method of claim 13 further including forming a second conductor extending from the first surface of the first semiconductor layer, through the first semiconductor layer and intersecting the first semiconductor region wherein the second conductor forms a second multiply-connected domain that encloses a second portion of the first semiconductor layer; and forming the second P-N diode in the second portion of the first semiconductor layer.

16. The method of claim 13 further including forming an isolation trench extending from the first surface of the first semiconductor layer, through the first semiconductor layer, through the first semiconductor region, and into the semiconductor substrate, wherein the isolation trench forms a second multiply-connected domain that encloses the first conductor and a second portion of the first semiconductor layer.

17. The method of claim 13 further including forming a doped region of the second conductivity type on the first surface of the first semiconductor layer and overlying the first semiconductor region wherein the doped region is external to the first portion of the first semiconductor layer.

18. The method of claim 17 further including forming a plurality of conductors extending from the doped region, through the first semiconductor layer and intersecting the first semiconductor region.

19. An ESD device comprising:
a semiconductor substrate of a first conductivity type and having a first doping concentration, the semiconductor substrate having first and second surfaces;
a first semiconductor layer of a second conductivity type on the first surface of the semiconductor substrate, the first semiconductor layer having a first surface that is opposite to the first surface of the semiconductor substrate and having a second doping concentration that is less than the first doping concentration;
a first semiconductor region of the second conductivity type positioned between a first portion of the first semiconductor layer and the first surface of the semiconductor substrate, the first semiconductor region forming a zener diode with dopants of the semiconductor substrate;
a first P-N diode formed in the first semiconductor layer and overlying a first portion of the first semiconductor region; and
a second P-N diode formed in the first semiconductor layer and overlying a second portion of the first semiconductor region, the second P-N diode spaced laterally apart from the first P-N diode.

20. The ESD device of claim 19 wherein the ESD device is formed to conduct an ESD current to flow laterally through the semiconductor substrate but not flow through the second surface of the semiconductor substrate.

* * * * *